United States Patent [19]

Aota et al.

[11] Patent Number: 5,768,105
[45] Date of Patent: Jun. 16, 1998

[54] FLEXIBLE WIRING BOARD HAVING A TERMINAL ARRAY EXTENDING ALONG A WHOLE EDGE OF ITS SUBSTRATE AND A CONNECTION STRUCTURE OF THE FLEXIBLE WIRING BOARD WITH A CIRCUIT BOARD

[75] Inventors: Keiji Aota, Osaka; Masaaki Ooga, Tenri; Yasunobu Tagusa, Ikoma, all of Japan

[73] Assignee: Sharp Kabushiki Kaisha, Osaka, Japan

[21] Appl. No.: 643,928

[22] Filed: May 7, 1996

Related U.S. Application Data

[62] Division of Ser. No. 338,013, Nov. 10, 1994, Pat. No. 5,546,279.

[30] Foreign Application Priority Data

Nov. 10, 1993 [JP] Japan ................... 5-281051

[51] Int. Cl.⁶ ............................................ H05K 7/02
[52] U.S. Cl. .................... 361/777; 174/254; 174/261; 349/149; 349/152; 439/77
[58] Field of Search ................... 174/254, 261, 174/268, 117 F, 117 A; 228/180.21; 257/676, 692, 700, 735, 734, 918; 349/149, 150, 151, 152; 439/67, 77, 66, 91, 493, 591, 86; 361/748, 749, 760, 772, 774, 775, 777, 779, 783, 784, 789, 790, 803

[56] References Cited

U.S. PATENT DOCUMENTS

| 4,655,551 | 4/1987 | Washizuka et al. | 349/150 |
| 4,770,641 | 9/1988 | Rowlette. | |
| 4,814,040 | 3/1989 | Ozawa. | |
| 5,033,824 | 7/1991 | Bohmer | 349/151 |
| 5,041,183 | 8/1991 | Nakamura et al. | |
| 5,045,249 | 9/1991 | Jin et al. | |
| 5,168,384 | 12/1992 | Genba | 349/150 |
| 5,402,255 | 3/1995 | Nakanishi et al. | 349/150 |
| 5,448,387 | 9/1995 | Kurokawa et al. | 361/749 |

FOREIGN PATENT DOCUMENTS

| 61-142670 | 6/1961 | Japan. |
| 63-184781 | 7/1963 | Japan. |

*Primary Examiner*—Donald Sparks
*Attorney, Agent, or Firm*—David G. Conlin; Brian L. Michaelis

[57] ABSTRACT

A flexible wiring board is adapted to be connected with a circuit board by means of an anisotropic conductive film. A flexible substrate of the flexible wiring board is mounted with an integrated circuit and has a generally rectangular connection portion. The connection portion includes a first edge of the substrate and parts of second and third edges adjoining the first edge of the substrate. A plurality of connection terminals are provided in the connection portion of the substrate. These connection terminals extend perpendicular to and arranged along the first edge of the substrate. Opposite end parts including the parts of the second and third edges of the connection portion do not extend beyond the connection terminals located closest to the second and third edges, respectively.

10 Claims, 8 Drawing Sheets

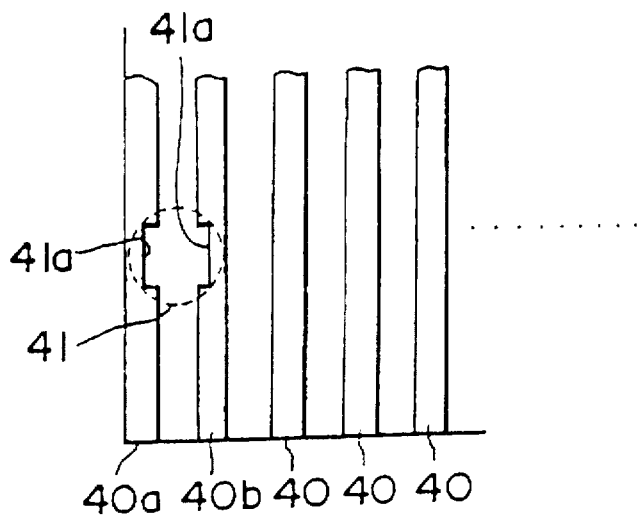
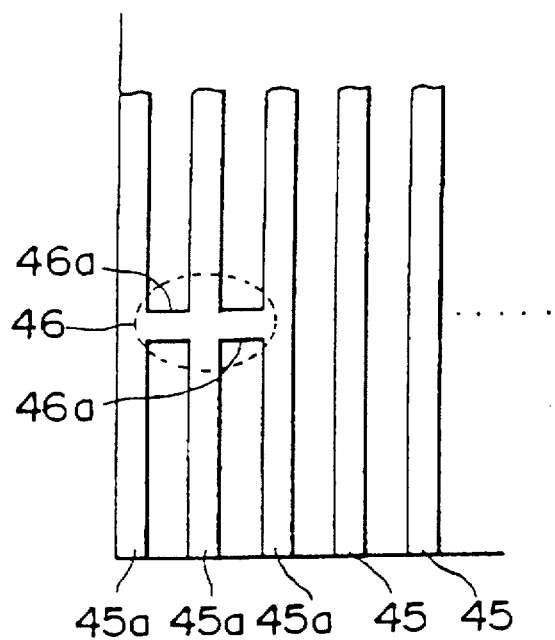
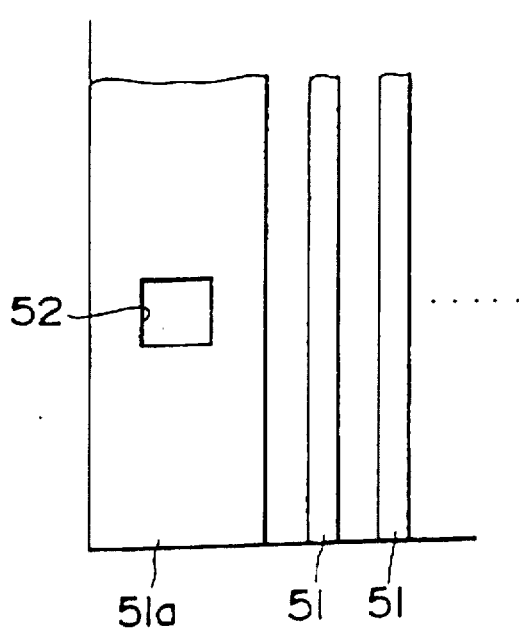

FLEXIBLE WIRING BOARD HAVING A TERMINAL ARRAY EXTENDING ALONG A WHOLE EDGE OF ITS SUBSTRATE AND A CONNECTION STRUCTURE OF THE FLEXIBLE WIRING BOARD WITH A CIRCUIT BOARD

This is a divisional of application Ser. No. 08/338,013 filed on Nov. 10, 1994 now U.S. Pat. No. 5,546,279.

BACKGROUND OF THE INVENTION

1. Field of the Invention

The present invention relates to a flexible wiring board to be connected with a circuit board by means of an anisotropic conductive film and a connection structure thereof with the circuit board.

2. Description of the Prior Art

FIG. 11 shows a fragmentary perspective view of a prior art flexible wiring board at a location where connection terminals are provided. FIG. 16 shows a plan view of a prior art flexible wiring board. Generally in a flexible wiring board mounted with an integrated circuit, as shown in FIGS. 11 or 16 (the integrated circuit is not shown in FIG. 11), opposite end portions, indicated by A in FIG. 11, of an edge of a substrate or base film 2 of the flexible wiring board 1 extend beyond an array of connection terminals 3. The connection terminals 3 extend perpendicular to the edge of the substrate 2 and are arranged along the edge of the substrate.

When connecting the flexible wiring board 1 having the above-mentioned structure with a circuit board by means of an anisotropic conductive film, there occurs a problem that an unstable contact resistance results at both side portions of the array of the connection terminals 3. The contact resistance of the connection terminals 3a located in the outermost positions is relatively stable. However, the contact resistances at the connection terminals 3b of the second outermost lines and the connection terminals 3c of the third outermost lines are particularly unstable.

The reason why the contact resistance of the connection terminals 3b of the second outermost lines is unstable will now be described with reference to FIGS. 13–15 which illustrate various steps of a connection process for connecting the flexible wiring board 1 and a circuit board 6.

When the flexible wiring board 1 and the circuit board 6 are connected with each other by means of an anisotropic conductive film 5, a cushioning material 7 made of silicone rubber or the like is interposed between a pressure tool 8 and the flexible wiring board 1, as shown in FIG. 13, in order to relieve the instability at the connection portions due to variations in thickness of the substrate 2 of the flexible wiring board 1 and a substrate of the circuit board 6. Therefore, when a pressure is applied by means of the pressure tool 8, the cushioning material 7 is deformed downward to distort the end portions B of the substrate 2 as shown in FIG. 14. When the pressure tool 8 is thereafter moved upward, the end portions of the substrate 2 of the flexible wiring board 1 remain deformed adhering to the circuit board 6 at portions indicated by C in FIG. 15. As a result, the connection terminals 3b of the second outermost lines are lifted by the outermost connection terminals 3a serving as a fulcrum.

A reference numeral 9 in FIG. 15 denotes conductive particles 9 included in the anisotropic conductive film 5. The conductive particles 9 are not shown in FIGS. 13 and 14 for the sake of simplicity.

FIG. 12 shows results of a reliability test of the flexible wiring board 1 of FIG. 11 done at 65° C. and 95% RH with respect of the contact resistances of the connection terminals 3b of the second outermost lines in a terminal array and the connection terminals 3 of the lines other than the second outermost lines for the substrate 2 of the flexible wiring board 1 which outwardly protrudes by 0.15 mm to 1.0 mm from each of the outermost connection terminals 3a in the terminal array. The substrate 2 used was formed of polyimide and had a thickness of 75 $\mu m'$. The connection terminals 3 each were formed of a copper foil in a weight of 1 oz, and the pitch of arrangement thereof was 0.8 mm.

As obvious from the test results shown in FIG. 12, the above-mentioned lift of the connection terminals 3b of the second outermost lines is a cause of the instability of the contact resistance in an initial stage of a reliability test or after the reliability test.

In order to compensate for the instability of the contact resistance, a specified number (2 to 10) of dummy terminals 12 are provided on both sides of the array of the connection terminals 3, as shown in FIG. 16. This arrangement, however, causes the following problems.

(1) It occasionally takes place that the connection terminals 3 are required to be arranged in a limited space (length) due to a restriction in product design. In such a case, provision of dummy terminals reduces the pitch of the connection terminals 3 accordingly, and the connection terminals connected at such a reduced pitch will cause leak or other failure, which results in a degraded reliability.

(2) On the other hand, when the dummy terminals are provided without reducing the pitch of arrangement of the connection terminals 3, the area occupied by the connection terminals 3 increases, resulting in a dimensional increase of the product.

Furthermore, in the conventional flexible wiring board of FIG. 16, alignment marks 13 for aligning the connection terminals 3 with respect to counterpart terminals are provided on the substrate 2 on both sides of the array of the connection terminals 3 of the signal input side and on both sides of the other array of the connection terminals of the signal output side. This increases the length of the flexible wiring board 1 in the direction in which the connection terminals 3 are arranged, and consequently increases the size of the whole product and material costs.

SUMMARY OF THE INVENTION

The object of the present invention is therefore to provide a flexible wiring board having a reduced size and an increased reliability and also to provide a reliable connection structure of such a flexible wiring board with a circuit board via an anisotropic conductive film.

In order to accomplish the above object, the present invention provides a flexible wiring board comprising a flexible substrate mounted with an integrated circuit and having a generally rectangular connection portion including a first edge of the substrate and parts of second and third edges adjoining the first edge of the substrate, and a plurality of connection terminals provided in the connection portion of the substrate, the connection terminals extending perpendicular to and arranged along the first edge of the substrate. Opposite end parts of the connection portion which include the parts of the second and third edges do not extend outside beyond the connection terminals located closest to the second and third edges, respectively.

In connecting the connection terminals of the flexible wiring board having the above arrangement with connection terminals of a circuit board using an anisotropic conductive film, a pressure will be applied to the substrate of the flexible wiring board through a cushioning material as conventionally done. Such pressure, however, will not curve the end portions of the substrate of the flexible wiring board downward nor adhere them to the circuit board. Therefore, the connection terminals of the second outermost lines, i.e., the connection terminals the second closest to the second and third edges of the substrate, are not lifted or separated from the counterpart terminals of the circuit board, so that a good reliability is provided. Furthermore, according to the present invention, because no connection terminals are prevented from being lifted from the circuit board, it is not necessary to provide dummy terminals which have been required in the conventional flexible wiring board.

If the flexible wiring board of the present invention and the prior art flexible wiring board of FIG. 16 are the same in the number of the connection terminals and the space for the terminals, inclusive of dummy terminals, the pitch of the connection terminals in the present invention can be made larger than the pitch of the connection terminals in the prior art flexible wiring board including dummy terminals, so that reliability is improved.

If the flexible wiring boards of the present invention and the prior art are the same in the number of the connection terminals and the pitch of the connection terminals, a connection area occupied by the connection terminals only of the present invention is smaller than a connection area occupied by both the connection terminals and the dummy terminals of the prior art, so that the size of the flexible wiring board can be reduced.

Furthermore, if the flexible wiring boards of the present invention and the prior art are the same in the pitch of the connection terminals and the connection area or terminal occupation area, the flexible wiring board of the present invention can be provided with a larger number of connection terminals than the prior art flexible wiring board including the dummy terminals as well as the connection terminals, so that high density assembling is achieved.

In an embodiment of the present invention, the connection terminals form a plurality of terminal arrays spaced from each other. The plurality of terminal arrays include first and second arrays, and at least part of the integrated circuit is located in the connection portion of the substrate between the first and second terminal arrays. In an embodiment, the connection terminals in the plurality of terminal arrays are connected with input terminals of the integrated circuit. In another embodiment, the connection terminals in the plurality of terminal arrays are connected with output terminals of the integrated circuit.

With this arrangement, the dimension of the flexible wiring board in the direction in which the connection terminals extend is made smaller, as compared with the flexible wiring board having the whole integrated circuit in a substrate portion other than the aforesaid connection portion.

In an embodiment, the substrate has another generally rectangular connection portion including a fourth edge of the substrate and parts of fifth and sixth edges adjoining the fourth edge of the substrate. Another plurality of connection terminals are provided in the another connection portion of the substrate, the connection terminals extending perpendicular to and arranged along the fourth edge of the substrate. Opposite end portions including the parts of the fifth and sixth edges of the another connection portion do not extend beyond the connection terminals located closest to the fifth and sixth edges, respectively.

In an embodiment, the substrate is rectangular, and the fifth edge is identical with the second edge and the sixth edge is identical with the third edge.

The flexible wiring board of the present invention further comprises alignment marks provided in the connection terminals positioned in the opposite end portions of the connection portion of the substrate. Examples of such alignment marks will be described in detail later.

Because the alignment marks for position alignment are directly provided in one or more connection terminals positioned in each end portion of the connection portion of the substrate in the present invention, it is not necessary to secure an area for forming an alignment mark in the flexible wiring board substrate. Therefore, the flexible wiring board of this invention is made smaller than the prior art flexible board wherein the alignment marks are formed outside of the terminal array.

BRIEF DESCRIPTION OF THE DRAWINGS

The present invention will become more fully understood from the detailed description given hereinbelow and the accompanying drawings which are given by way or illustration only, and thus are not limitative of the present invention, and wherein:

FIG. 8 shows an exemplified alignment mark for use in the flexible wiring boards of the embodiments of the present invention;

FIG. 9 shows another alignment mark for use in the embodiments of the present invention;

FIG. 10 shows a further alignment mark for use in the embodiments of the present invention;

FIGS. 13–15 illustrate various steps of a connection process for connecting the flexible wiring board of FIG. 11 with a circuit board, wherein FIG. 13 shows a condition prior to pressure application, FIG. 14 shows a condition in the stage of applying a pressure, and FIG. 15 shows a condition in the stage of removing the pressure subsequent to the condition shown in FIG. 14.

DETAILED DESCRIPTION OF THE PREFERRED EMBODIMENTS

Figure 1:
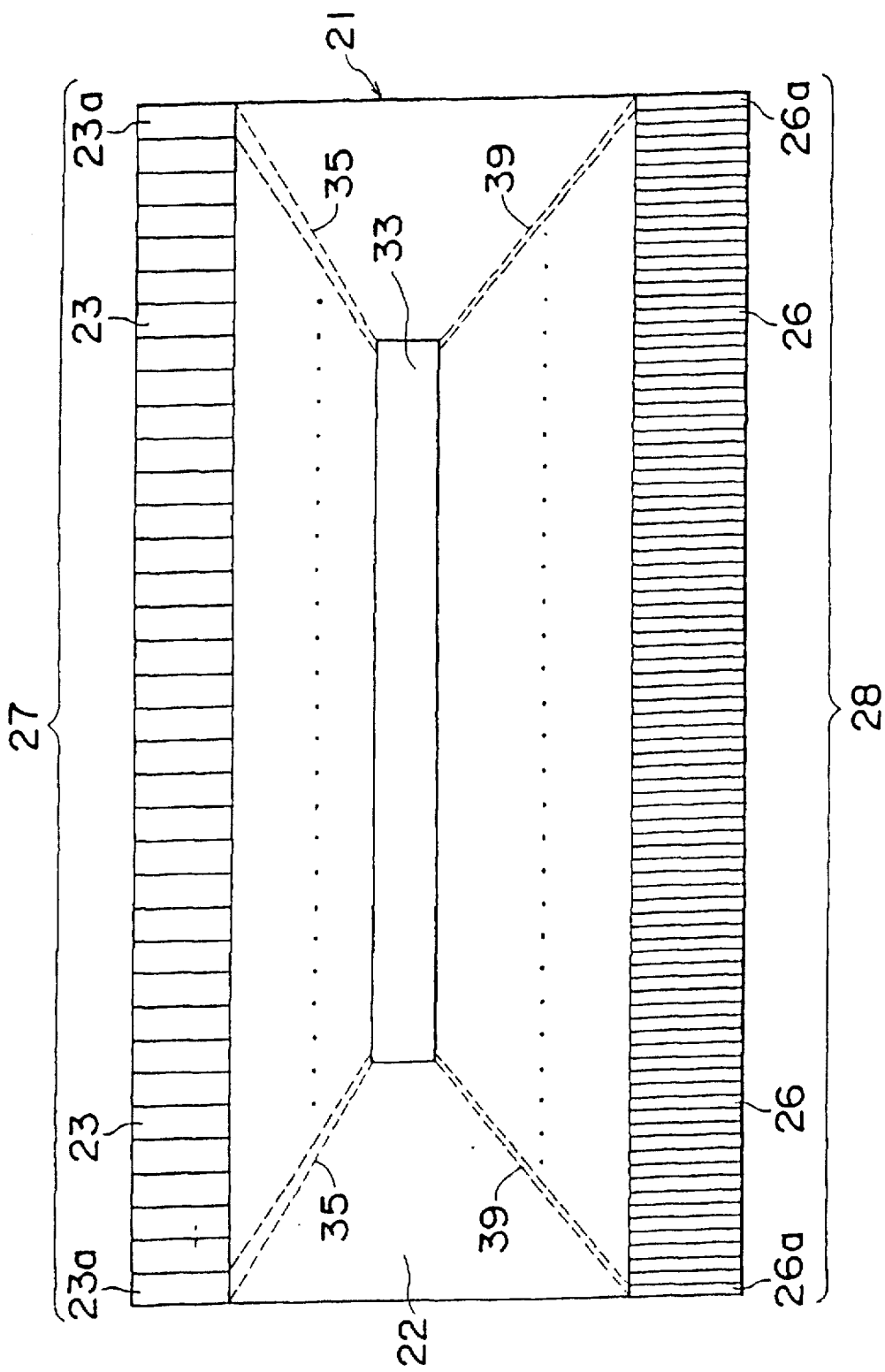
FIG. 1 is a schematic plan view of a flexible wiring board according to an embodiment of the present invention.
Figure 2:
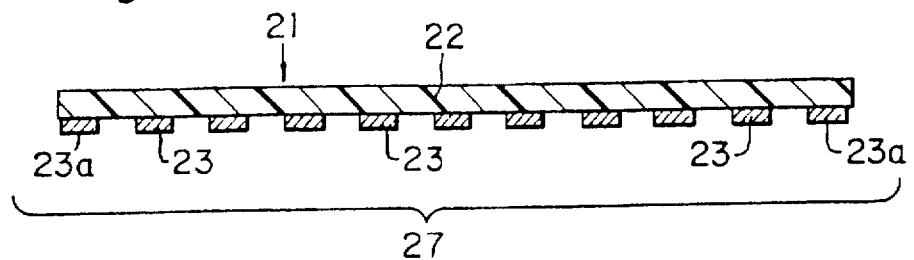
FIG. 2 is a sectional view of a connection portion of the flexible wiring board of FIG. 1.

FIG. 1 is a schematic plan view of a flexible wiring board according to an embodiment of the present invention and FIG. 2 is a sectional view of a connection portion of the flexible wiring board of FIG. 1.

As shown in FIGS. 1 and 2, a flexible wiring board 21 has an array 27 of substantially parallel connection terminals 23 (referred to as "terminal array") and another array 28 of substantially parallel connection terminals 26 on a rectangular base film, i.e., substrate 22 thereof. Substrate portions having the terminal arrays 27, 28 are defined as connection portions of the substrate 22. The connection terminals 23 are connected with input terminals (not shown) of an integrated circuit 33 by the wiring 35 and the connection terminals 26 are connected with output terminals of the integrated circuit 33 by the wiring 39. The connection terminals 23 each extend perpendicular to an edge of the substrate 22, and the terminal array 27 runs the whole length of the edge. Similarly, the connection terminals 26 each extend perpendicular to an opposite edge of the substrate 22, and the terminal array 28 runs the whole length of the edge. In other words, both lateral end portions of the connection portions of the substrate 22 do not extend beyond the outermost connection terminals 23a, 26a in the respective terminal arrays 27, 28.

Note that in FIG. 1 no spaces are shown between the connection terminals and that only a few of the connection terminals 23 are shown in FIG. 2 for the sake of simplicity.

Figure 3:
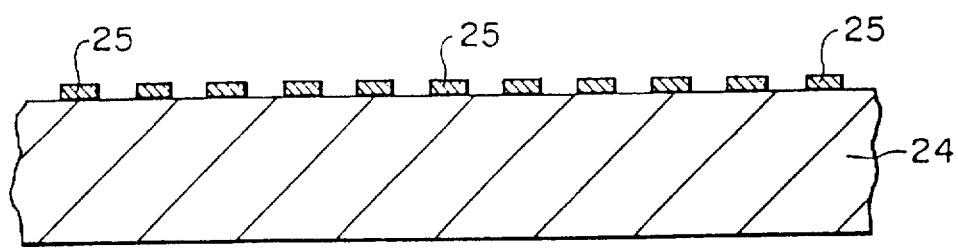
FIG. 3 is a sectional view of a connection portion of a circuit board to be connected with the connection portion of the flexible wiring board shown in FIG. 2.

The flexible wiring board 21 will be electrically connected with a circuit board 24 shown in FIG. 3 with the connection terminals 23 of the flexible wiring board 21 being connected to corresponding connection terminals 25 of the circuit board 24 in one-to-one correspondence by means of an anisotropic conductive film as follows.

(1) First, an anisotropic conductive film 26 (see FIG. 4) is transferred onto either the connection terminals of the flexible wiring board 21 or the connection terminals of the circuit board 24.

(2) Then the connection terminals of the flexible wiring board 21 and the connection terminals of the circuit board 24 are aligned in position utilizing alignment marks which will be described in detail later.

Figure 13:
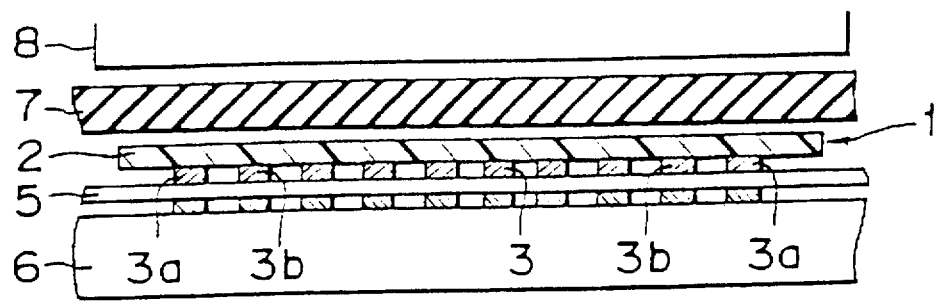
Figure 14:
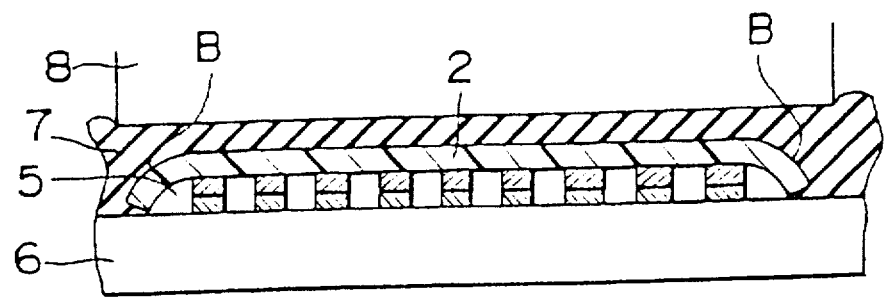
Figure 15:
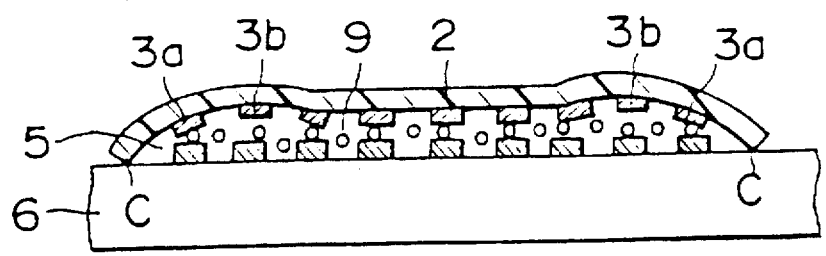

(3) Finally, the anisotropic conductive film is hardened while a pressure is applied from behind the flexible wiring board 21 via a cushioning material by means of a pressure tool (see FIG. 13) heated by a constant heat (i.e., heated at a constant temperature) or a pulse heat (i.e., heated temporarily).

Figure 4:
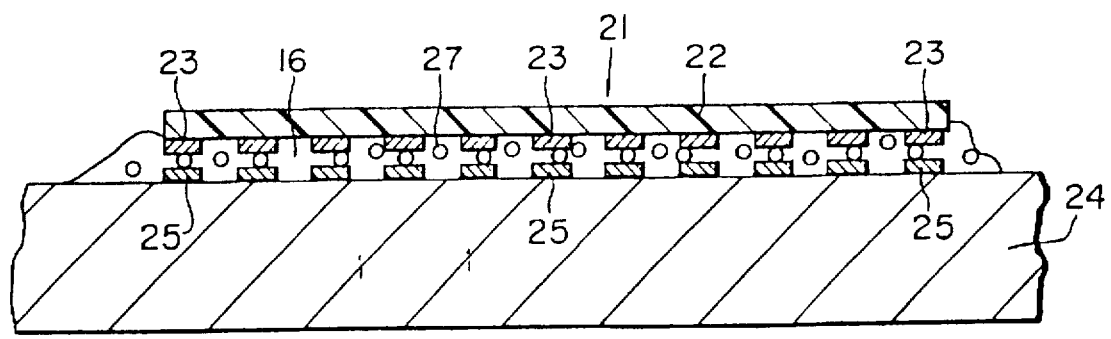
FIG. 4 is a sectional view of the connection portions of the flexible wiring board shown in FIG. 2 and the circuit board shown in FIG. 3 when connected with each other by means of an anisotropic conductive film.

Thus the connection terminals 23 of the flexible wiring board 21 and the connection terminals 25 of the circuit board 24 are connected with each other in one-to-one correspondence by the anisotropic conductive film 26 including conductive particles 27 in a manner as shown in FIG. 4.

The connection terminals 26 can be connected with a circuit board in the similar way.

As described above, the connection terminals 23 are arrayed along an edge of the substrate 22 of the flexible wiring board 21 such that both ends of the substrate 22 do not extend beyond the outermost connection terminals 23a of the terminal array 27. Therefore, even when a pressure is applied from the pressure tool to the flexible wiring board 21 via the cushioning material in connecting the flexible wiring board 21 with the circuit board 24 by means of the anisotropic conductive film 26, the end portions of the substrate 22 are prevented from being deformed and adhering to the circuit board 24. As a result, after the pressure is removed, the connection terminals 23 of the second outermost lines are prevented from being lifted by turning upward on the outermost connection terminals 23a serving as fulcra.

In other words, in the present embodiment, it is not necessary to provide dummy terminals on both sides of the array 27 of the connection terminals 23. Accordingly, provided that the flexible wiring boards of the present embodiment and the prior art are the same in the number of the connection terminals and the space for the terminals, the pitch of the connection terminals 23 in the present embodiment is made larger than the pitch of the connection terminals 3 in the prior art flexible wiring board including dummy terminals 12. Therefore, even when a restriction is imposed on the width of the terminal array, it is possible to connect the flexible wiring board 21 with the circuit board 24 without reducing the pitch of the connection terminals 23.

On the other hand, provided that the flexible wiring boards of the present embodiment and the prior art are the same in the number of the connection terminals 23, 3 and the pitch of the connection terminals 23, 3, an area occupied by the terminal array including only the connection terminals 23 of the present embodiment is smaller than an area occupied by the terminal array including both the connection terminals 3 and the dummy terminals 12. Accordingly, a size of the flexible wiring board can be reduced.

Furthermore, provided that the flexible wiring boards of the present embodiment and the prior art are the same in the pitch of the connection terminals 23, 3 and the connection area or terminal occupation area, the flexible wiring board of the present embodiment can be provided with a larger number of connection terminals 23 than the prior art flexible wiring board including the dummy terminals 12 as well as the connection terminals 3.

The above is true with the connection terminals 26.

The present embodiment can achieve a compact, low-cost terminal structure having a high reliability.

Figure 5:
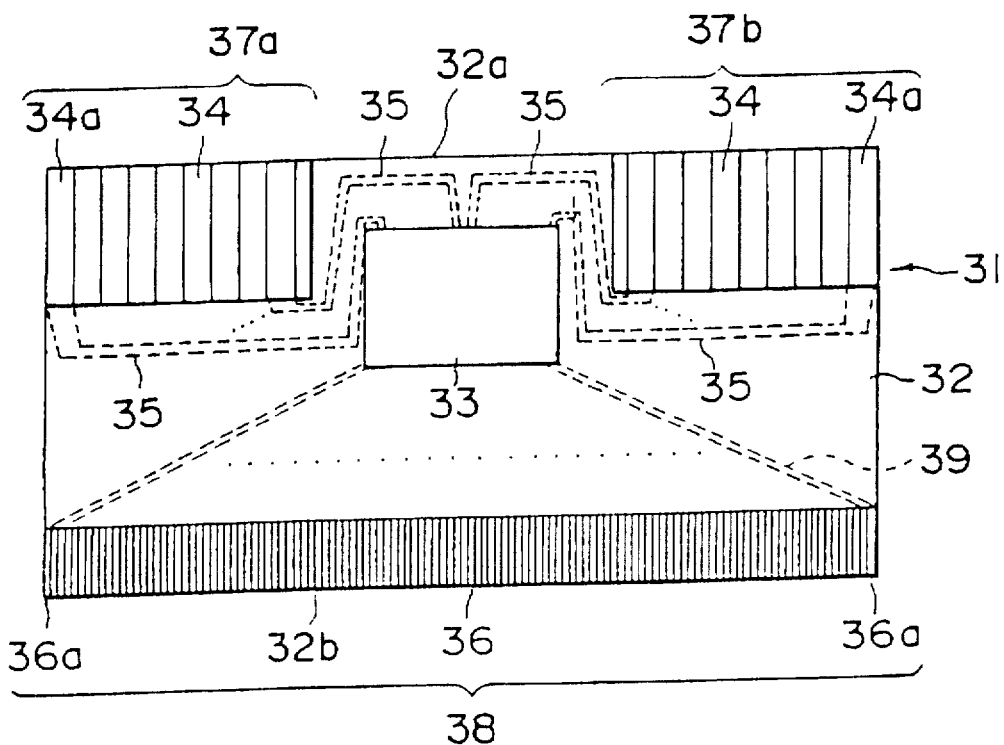
FIG. 5 is a schematic plan view of a flexible wiring board according to another embodiment of the present invention.
Figure 6:
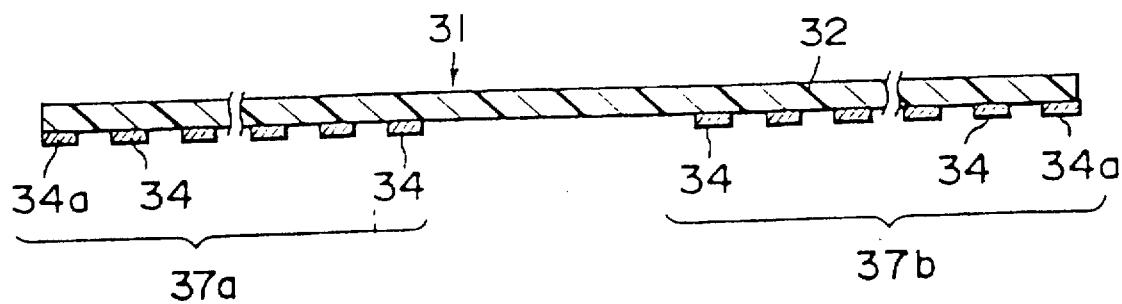
FIG. 6 is a sectional view of a connection portion of the flexible wiring board shown in FIG. 5.

FIG. 5 is a plan view of a flexible wiring board 31 of another embodiment of the present invention, and FIG. 6 is a sectional view of a connection portion of the flexible wiring board of FIG. 5. The flexible wiring board 31 of FIG. 5 is different from the flexible wiring board 21 of FIG. 1 in that the connection terminals provided along an edge of the substrate form two terminal arrays which are spaced from each other and that an integrated circuit is provided in a space between the two terminal arrays, as described in more detail below.

The present flexible wiring board 31 has an array 38 of connection terminals 36 for signal output (referred to as "output-side connection terminals") along an edge 32a of its rectangular substrate 32 and two arrays 37a and 37b of connection terminals 34 for signal input (referred to as "input-side connection terminals") along an edge 32b opposite to the edge 32a of the substrate 32. The two arrays 37a and 37b of the input-side connection terminals 34 are spaced from each other and between these arrays 37a and 37b is located an integrated circuit 33. The input-side connection terminals 34 are connected with corresponding input terminals (not shown) of the integrated circuit 33 by way of wiring 35 routed through empty spaces beside the integrated circuit 33. The output-side connection terminals 36 are connected with corresponding output terminals (not shown) of the integrated circuit 33 by way of wiring 39. Substrate portions including the terminal arrays 37a and 37b, and 38 are defined as connection portions of this flexible wiring board 31.

7

Similar to the first embodiment, lateral end portions of the connection portions including parts of the other edges of the substrate 32 do not extend outside beyond the outermost connection terminals 36a and 34a in the respective terminal arrays. This feature produces effects as described above in connection with the first embodiment.

The arrangement that the integrated circuit is disposed between the two arrays of the input-side connection terminals can reduce the dimension of the substrate 32 in the direction in which the connection terminals extend, as compared with the first embodiment.

The input-side connection terminals 36 of the flexible wiring board may be grouped into more terminal arrays. In such a case, at least part of the integrated circuit 33 is disposed between any two of those terminal arrays.

Figure 7:
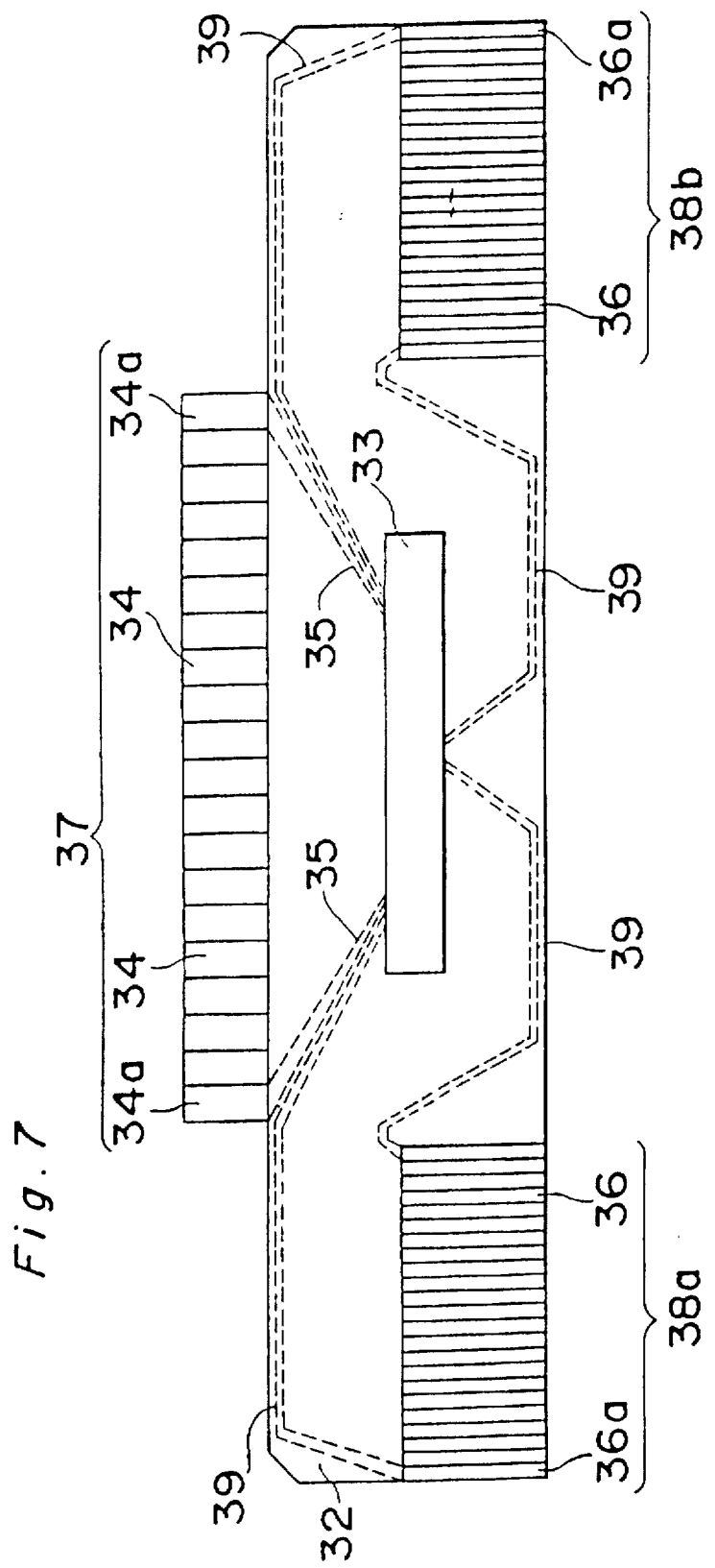
FIG. 7 is a schematic plan view of a flexible wiring board according to another embodiment of the present invention.
Figure 11:
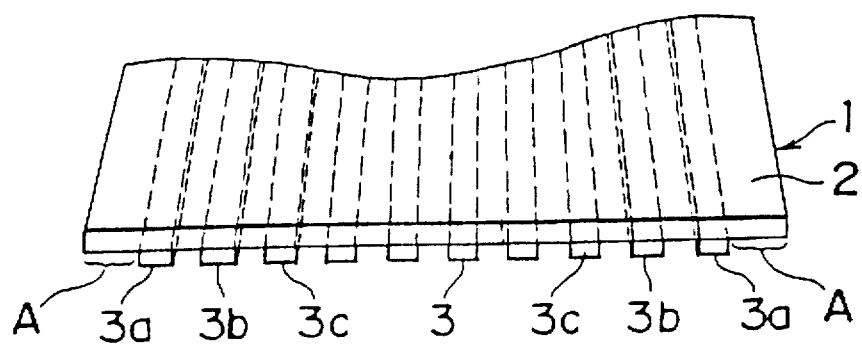
FIG. 11 is a fragmentary perspective view of a connection portion of a prior art flexible wiring board.
Figure 12:
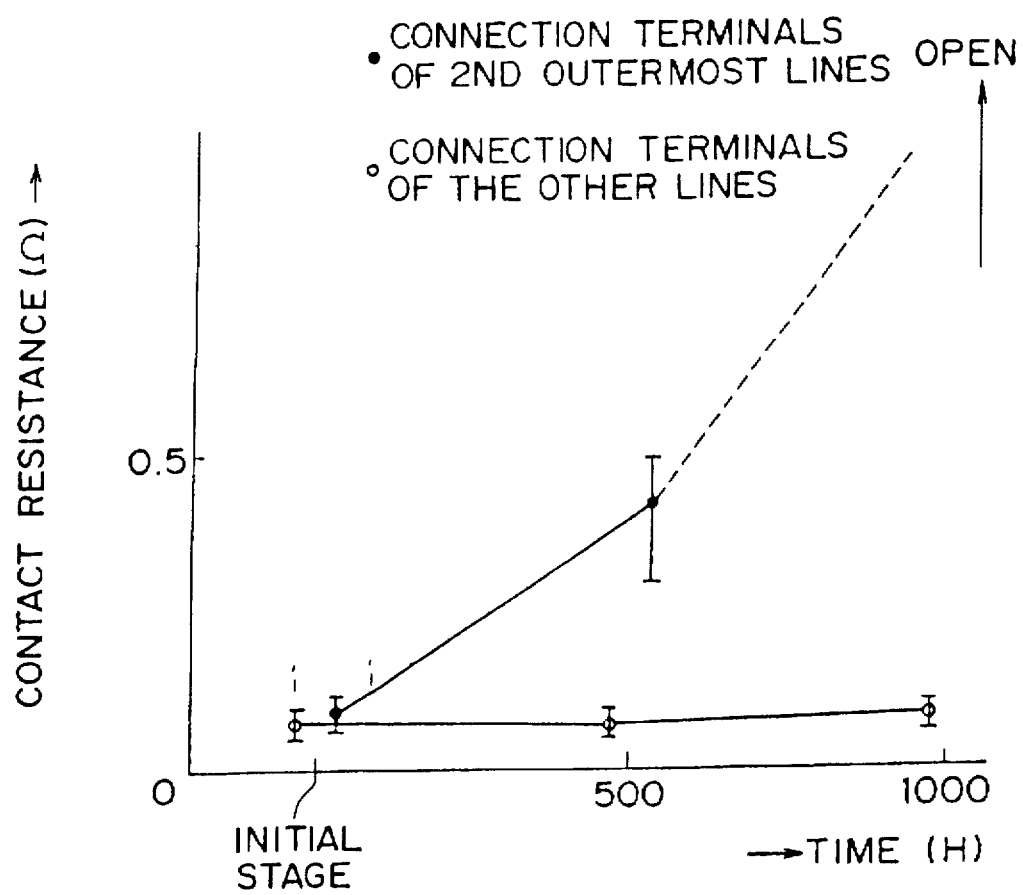
FIG. 12 is a graph showing results of a reliability test of the flexible wiring board of FIG. 11 with respect to the contact resistances of connection terminals of the second outermost lines in an terminal array and the contact resistances of the other connection terminals in the terminal array.

Instead of the input-side connection terminals 34, the output-side connection terminals 36 may be divided into two or more arrays and the integrated circuit may be interposed between two of the arrays of the output-side terminals as shown in FIG. 7. In FIG. 7, the output-side connection terminals 36 are divided into two terminal arrays 38a and 38b and the integrated circuit 33 is disposed between these terminal arrays 38a and 38b. It will be easily understood that although not shown in figures, both the input-side connection terminals and the output-side terminals may be divided into two or more arrays and the integrated circuit may be disposed in a space between two of the arrays of the output-side terminals and between two of the arrays of the input-side terminals. In this case the dimension of the substrate 32 in the direction in which the connection terminals extend will be further reduced.

FIGS. 8 through 10 show examples of alignment marks applicable to each of the aforementioned embodiments.

Figure 16:
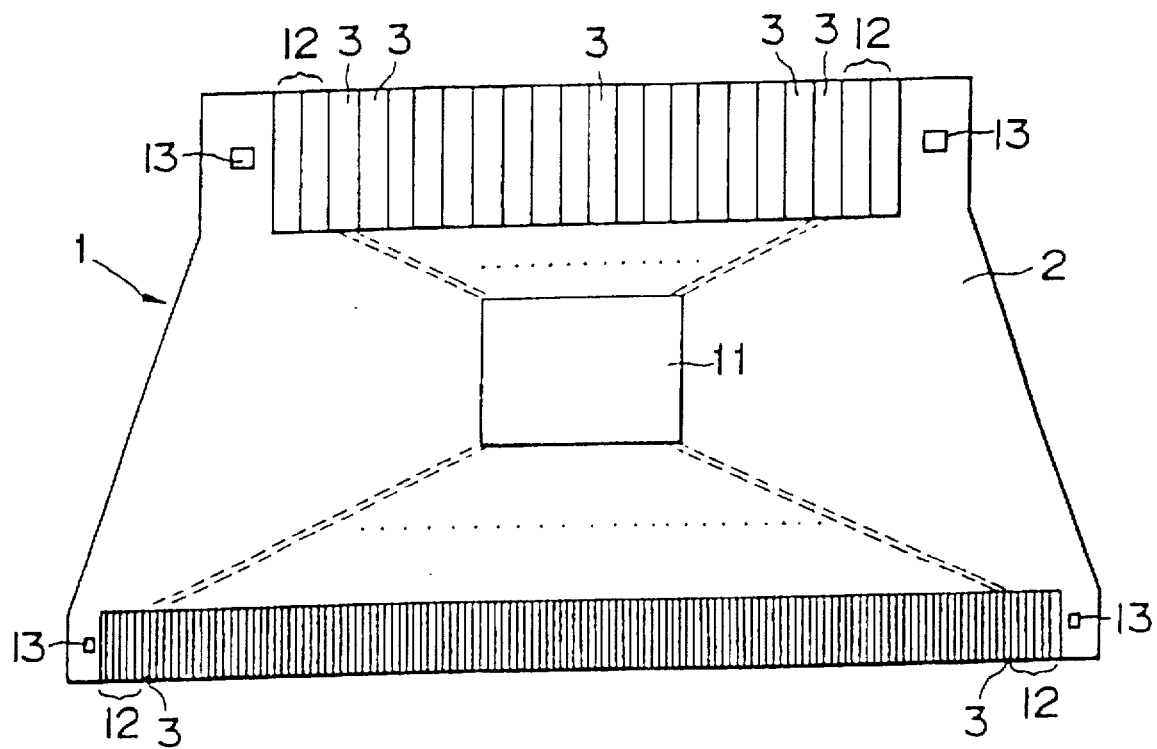
FIG. 16 is a plan view of another prior art flexible wiring board.

In each of the aforementioned embodiments, the substrates 22 and 32 of the flexible wiring boards 21 and 31 do not extend laterally outwardly beyond the terminal arrays 27, 28, 37, 37a, 37b, 38, 38a, 38b. Therefore, unlike the prior art of FIG. 16, alignment marks cannot be provided laterally outside of the connection terminals 23a, 26a, 34a, and 36a located in the outermost positions in the terminal arrays 27, 28, 37, 37a, 37b, 38, 38a, 38b. Therefore, the alignment marks (which are not shown in FIGS. 1–7) are formed directly in the connection terminals in the present invention.

Referring to FIG. 8, a generally U-shaped cutout 41a is formed in the outermost connection terminal 40a and the second outermost connection terminal 40b in the array of generally parallel terminals 40 such that the cutout 41a of the connection terminal 40a faces the cutout 41a of the connection terminal 40b. The two associated cutouts 41a form an alignment mark 41. The terminals 40 including the terminals 40a and 40b are electrically insulated from each other.

Referring to FIG. 9, three common terminals 45a located in the outermost positions of an array of terminals 45 arranged in parallel are connected with each other by linear connection members 46a and 46a having the same width. The two connection members 46a in association with the middle common terminal 45a form a cross-shaped alignment mark 46. In the field of TFT LCD panels, the common terminals are provided for the purpose of reducing the apparent contact resistance of the terminals and used as terminals to be connected with an opposite panel electrode, power supply terminals, etc.

Referring to FIG. 10, a rectangular hole 52 is formed in a connection terminal 51a located in the outermost position of an array of terminals 51 which are arranged in parallel and electrically insulated from each other. The hole 52 forms a rectangular alignment mark. The hole may have any appropriate shape.

The formation of an alignment mark within the terminal array in a manner as shown in FIGS. 8, 9 or 10 obviates the need of securing an area for the formation of the alignment mark in a substrate portion outside of the terminal array. The alignment mark as shown in FIGS. 8, 9 or 10 enables the connection terminals to be arranged on the substrate as shown in FIGS. 1, 5 or 7.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flexible wiring board, comprising:

a flexible substrate mounted with an integrated circuit and having a generally rectangular connection portion including a first edge of the substrate and parts of second and third edges adjoining said first edge of the substrate; and a plurality of connection terminals provided in said connection portion of the substrate, said connection terminals extending perpendicular to and arranged along said first edge of the substrate, wherein an end part of said connection portion which includes the first edge does not extend outside beyond the connection terminals and opposite end parts of said connection portion which include said parts of the second and third edges do not extend outside beyond the connection terminals located closest to said second and third edges, respectively.

2. The flexible wiring board as claimed in claim 1, wherein said connection terminals form a plurality of terminal arrays spaced from each other, said plurality of terminal arrays include first and second terminal arrays, and at least part of the integrated circuit is located in the connection portion of the substrate between the first and second terminal arrays.

3. The flexible wiring board as claimed in claim 2, wherein said connection terminals are connected with input terminals of said integrated circuit.

4. The flexible wiring board as claimed in claim 2, wherein said connection terminals are connected with output terminals of said integrated circuit.

5. The flexible wiring board as claimed in claim 1, wherein said first edge of the connection portion is coincident with an outer shorter edge of each connection terminal, and said parts of the second and third edges of the connection portion are coincident with an outer longer edge of the connection terminal, located closest to said second and third edges, respectively.

6. A connection structure between the flexible wiring board as claimed in claim 1 and a circuit board, wherein the connection terminals of the flexible wiring board are connected with connection terminals of the circuit board in one-to-one correspondence by means of an anisotropic conductive film.

7. A flexible wiring board, comprising:

a flexible substrate mounted with an integrated circuit and having a generally rectangular connection portion including a first edge of the substrate and parts of second and third edges adjoining said first edge of the substrate; and a plurality of connection terminals provided in said connection portion of the substrate, said connection terminals extending perpendicular to and arranged along said first edge of the substrate, wherein an end part of said connection portion which includes the first edge does not extend outside beyond the connection terminals and opposite end parts of said connection portion which include said parts of the second and third edges do not extend outside beyond the connection terminals located closest to said second and third edges, respectively;

wherein said connection terminals form a plurality of terminal arrays spaced from each other, said plurality of terminal arrays include first and second terminal arrays, and at least part of the integrated circuit is located in the connection portion of the substrate between the first and second terminal arrays;

wherein said connection terminals are connected with input terminals of said integrated circuit; and wherein said substrate has another generally rectangular connection portion including a fourth edge of the substrate and parts of fifth and sixth edges adjoining said fourth edge of the substrate, wherein another plurality of connection terminals are provided in said another connection portion of the substrate and connected to output terminals of said integrated circuit, said connection terminals extending perpendicular to and arranged along said fourth edge of the substrate, wherein an end part including the fourth edge of said another connection portion does not extend outside beyond the connection terminals and opposite end parts including said parts of the fifth and sixth edges of said another connection portion do not extend beyond the connection terminals located closest to said fifth and sixth edges, respectively.

8. The flexible wiring board as claimed in claim 7, wherein the fourth edge of said another connection portion is coincident with an outer shorter edge of each connection terminal, and said parts of the fifth and sixth edges of the connection portion are coincident with an outer longer edge of the connection terminals located closest to said fifth and sixth edges, respectively.

9. A flexible wiring board, comprising:

a flexible substrate mounted with an integrated circuit and having a generally rectangular connection portion including a first edge of the substrate and parts of second and third edges adjoining said first edge of the substrate; and a plurality of connection terminals provided in said connection portion of the substrate, said connection terminals extending perpendicular to and arranged along said first edge of the substrate, wherein an end part of said connection portion which includes the first edge does not extend outside beyond the connection terminals and opposite end parts of said connection portion which include said parts of the second and third edges do not extend outside beyond the connection terminals located closest to said second and third edges, respectively;

wherein said connection terminals form a plurality of terminal arrays spaced from each other, said plurality of terminal arrays include first and second terminal arrays, and at least part of the integrated circuit is located in the connection portion of the substrate between the first and second terminal arrays;

wherein said connection terminals are connected with output terminals of said integrated circuit; and wherein said substrate has another generally rectangular connection portion including a fourth edge of the substrate and parts of fifth and sixth edges adjoining said fourth edge of the substrate, wherein another plurality of connection terminals are provided in said another connection portion of the substrate and connected to input terminals of said integrated circuit, said connection terminals extending perpendicular to and arranged along said fourth edge of the substrate, wherein and end part including the fourth edge of said another connection portion does not extend outside beyond the connection terminals and opposite end parts including said parts of the fifth and sixth edges of said another connection portion do not extend beyond the connection terminals located closest to said fifth and sixth edges, respectively.

10. The flexible wiring board as claimed in claim 9, wherein the fourth edge of said another connection portion is coincident with an outer shorter edge of each connection terminal, and said fifth and sixth edges of the connection portion are coincident with an outer longer edge of the connection terminals located closest to said fifth and sixth edges, respectively.

* * * * *